US010188225B2

(12) United States Patent
Hagglund et al.

(10) Patent No.: US 10,188,225 B2
(45) Date of Patent: Jan. 29, 2019

(54) ADJUSTABLE SCANNER MOUNTING ASSEMBLY AND METHOD

(71) Applicant: Mettler-Toledo, LLC, Columbus, OH (US)

(72) Inventors: Curtis Hagglund, Worthington, OH (US); Gary Yeauger, Worthington, OH (US); Richard Bennett, Worthington, OH (US); Steve Kelly, Worthington, OH (US)

(73) Assignee: Mettler-Toledo, LLC, Columbus, OH (US)

( * ) Notice: Subject to any disclaimer, the term of this patent is extended or adjusted under 35 U.S.C. 154(b) by 817 days.

(21) Appl. No.: 14/267,899

(22) Filed: May 1, 2014

(65) Prior Publication Data

US 2015/0313380 A1    Nov. 5, 2015

(51) Int. Cl.

| F16M 11/00 | (2006.01) |
|---|---|
| A47F 9/04 | (2006.01) |
| H05K 5/02 | (2006.01) |
| F16M 13/02 | (2006.01) |
| G01G 19/414 | (2006.01) |
| G01G 21/23 | (2006.01) |
| G01G 21/28 | (2006.01) |

(52) U.S. Cl.
CPC .............. *A47F 9/04* (2013.01); *A47F 9/046* (2013.01); *F16M 13/022* (2013.01); *G01G 19/4144* (2013.01); *G01G 21/23* (2013.01); *G01G 21/28* (2013.01); *H05K 5/0217* (2013.01); *A47F 2009/041* (2013.01)

(58) Field of Classification Search
CPC .............................. G01G 21/28; G01G 21/23
See application file for complete search history.

(56) References Cited

U.S. PATENT DOCUMENTS

| 3,215,382 | A | * | 11/1965 | Stein | ..................... | A47D 11/02 248/172 |
|---|---|---|---|---|---|---|
| 3,799,488 | A | * | 3/1974 | Sena | ..................... | A47B 97/08 248/126 |
| 4,473,178 | A | * | 9/1984 | Bott | ........................ | B60R 9/045 224/321 |
| 4,830,531 | A | * | 5/1989 | Condit | .................. | F16B 37/045 403/348 |
| 5,052,454 | A | * | 10/1991 | Meinhardt | .......... | B23Q 9/0078 144/136.95 |
| 5,143,164 | A | | 9/1992 | Nahar | | |
| 5,333,385 | A | * | 8/1994 | Chou | .................. | B23Q 9/0035 30/310 |
| 5,599,031 | A | * | 2/1997 | Hodges | ................. | B62B 5/0083 280/35 |
| 5,810,542 | A | | 9/1998 | Ostrander | | |
| 6,176,281 | B1 | * | 1/2001 | Newman | .............. | B23Q 9/0042 144/144.1 |
| 6,179,543 | B1 | | 1/2001 | Adame et al. | | |

(Continued)

FOREIGN PATENT DOCUMENTS

| CN | 1417613 A | 5/2003 |
|---|---|---|
| CN | 1885898 A | 12/2006 |

(Continued)

*Primary Examiner* — Amy J. Sterling
(74) *Attorney, Agent, or Firm* — Standley Law Group LLP

(57) ABSTRACT

Assemblies and methods for adjustably mounting scanners in scale/scanner devices, and scale/scanner devices employing such assemblies.

12 Claims, 11 Drawing Sheets

(56) References Cited

U.S. PATENT DOCUMENTS

| | | | | |
|---|---|---|---|---|
| 6,679,461 B1* | 1/2004 | Hawkins | | F16L 3/00 |
| | | | | 248/346.01 |
| 7,300,029 B2* | 11/2007 | Petrick | | F16M 11/10 |
| | | | | 248/285.1 |
| 7,486,423 B2 | 2/2009 | Chang et al. | | |
| 7,708,235 B2* | 5/2010 | Hawkins | | F16L 3/24 |
| | | | | 248/346.01 |
| 7,735,270 B2* | 6/2010 | Olle | | F24F 13/0254 |
| | | | | 52/167.9 |
| 8,176,603 B2* | 5/2012 | Carnevali | | B60R 11/0241 |
| | | | | 24/522 |
| 8,272,609 B2* | 9/2012 | Chan | | H01L 23/4006 |
| | | | | 248/220.22 |
| 8,464,991 B2* | 6/2013 | Su | | F16B 5/0642 |
| | | | | 248/154 |
| 8,636,122 B2* | 1/2014 | Smith | | A45C 5/02 |
| | | | | 12/146 R |
| 9,333,642 B2* | 5/2016 | Courtney | | B25H 7/04 |
| 9,644,847 B2* | 5/2017 | Bhogal | | F24C 7/086 |
| 2009/0200443 A1* | 8/2009 | Burtscher | | F24J 2/5205 |
| | | | | 248/316.1 |
| 2010/0018571 A1* | 1/2010 | Placer | | F24J 2/4647 |
| | | | | 136/251 |
| 2010/0102011 A1* | 4/2010 | Blum | | F16B 37/045 |
| | | | | 211/8 |
| 2011/0100434 A1* | 5/2011 | Van Walraven | | F24J 2/5205 |
| | | | | 136/251 |
| 2011/0260026 A1* | 10/2011 | Ye | | F16M 11/04 |
| | | | | 248/298.1 |
| 2012/0126085 A1* | 5/2012 | Johnson | | A47C 7/002 |
| | | | | 248/346.03 |
| 2013/0043369 A1* | 2/2013 | Wheeler | | A47F 7/024 |
| | | | | 248/551 |
| 2014/0054430 A1* | 2/2014 | Jacobson | | F16M 13/022 |
| | | | | 248/295.11 |
| 2014/0090693 A1* | 4/2014 | Thomas | | H01L 31/042 |
| | | | | 136/251 |
| 2014/0091050 A1* | 4/2014 | Zhang | | H01L 31/048 |
| | | | | 211/26 |
| 2014/0091188 A1* | 4/2014 | Engelvin | | F16M 13/022 |
| | | | | 248/298.1 |
| 2014/0093307 A1* | 4/2014 | Zhang | | F16B 9/023 |
| | | | | 403/188 |
| 2015/0250315 A1* | 9/2015 | Gross | | F16M 11/10 |
| | | | | 361/679.01 |

FOREIGN PATENT DOCUMENTS

| | | |
|---|---|---|
| CN | 102589868 A | 7/2012 |
| CN | 102833451 A | 12/2012 |
| CN | 103517602 A | 1/2014 |
| JP | 3134217 B2 | 2/2001 |

\* cited by examiner

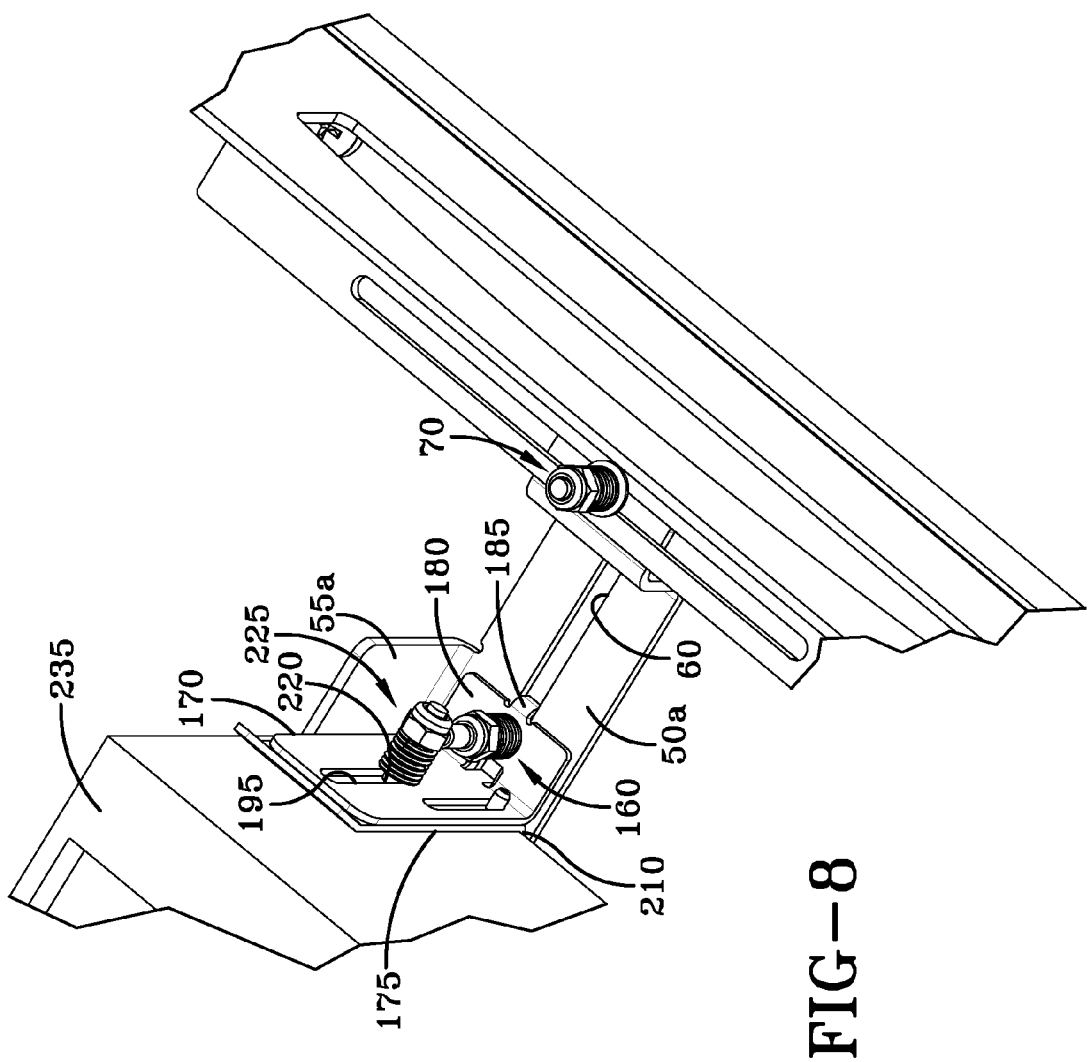

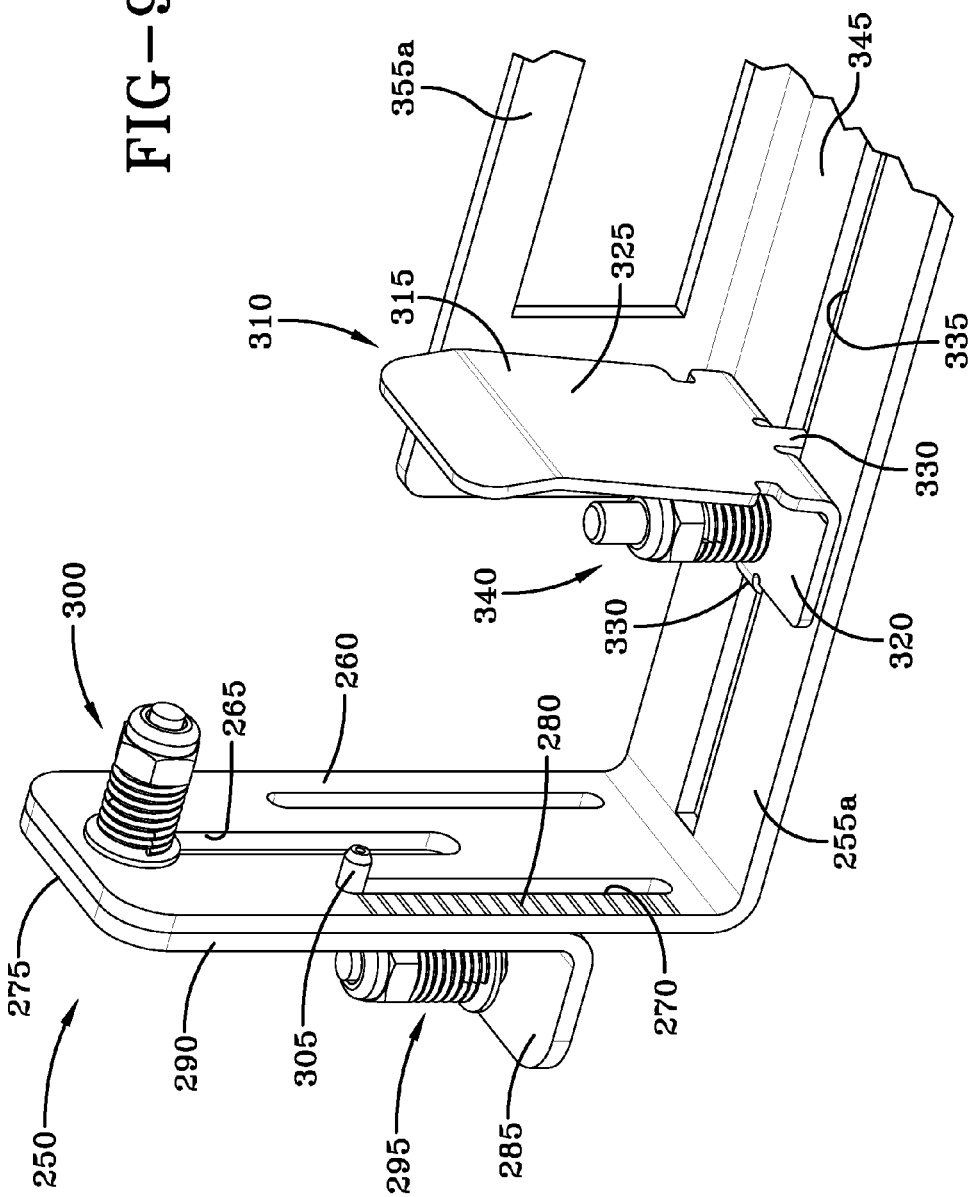

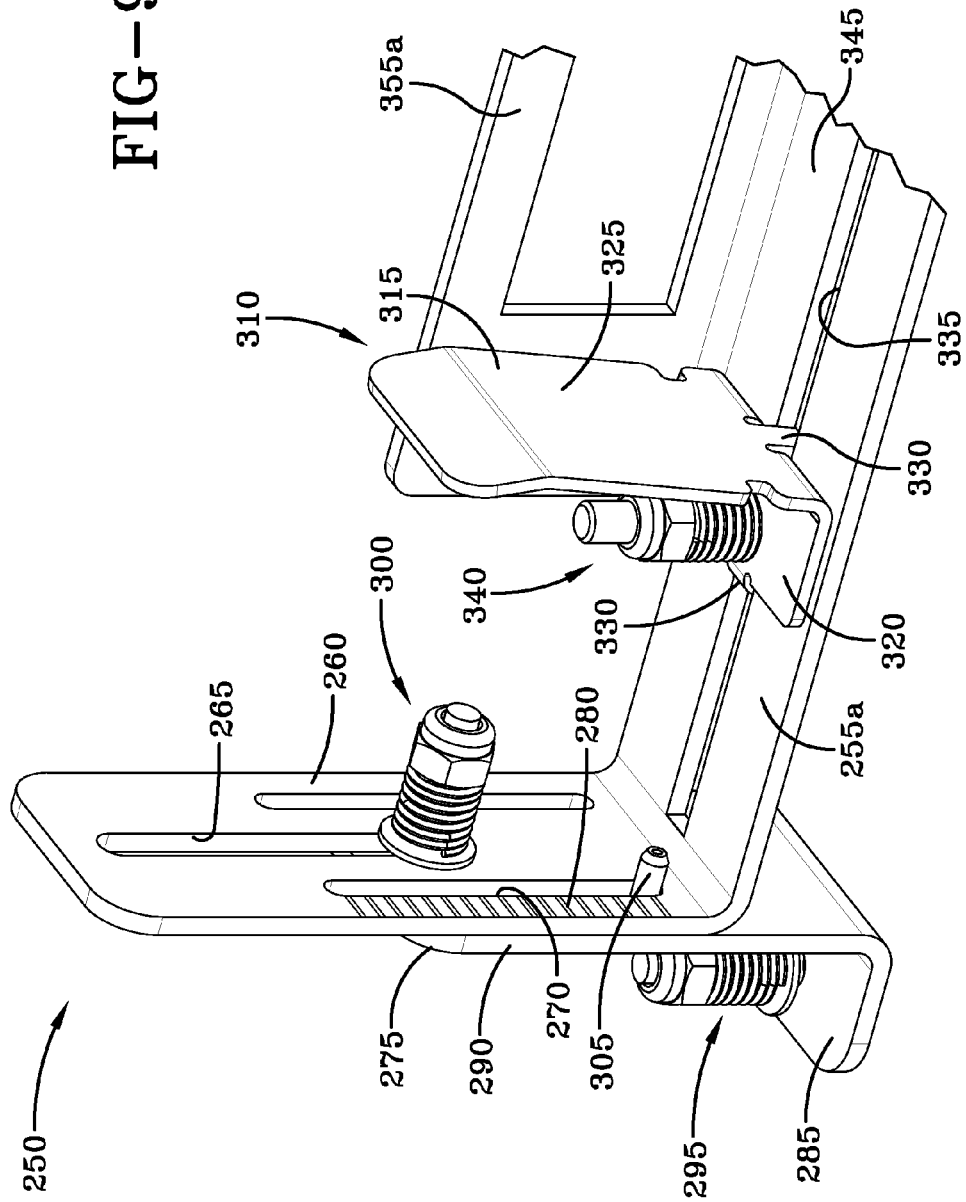

ADJUSTABLE SCANNER MOUNTING ASSEMBLY AND METHOD

TECHNICAL FIELD

Embodiments of the invention are directed to assemblies and methods for adjustably mounting scanners in scale/scanner devices, and to scale/scanner devices employing such assemblies.

GENERAL BACKGROUND

Those of skill in the art, as well as laypersons, are no doubt familiar with barcode scanners such as those that are located, for example, at a point-of-sale (POS) location within a retail establishment. Variations of these scanners exist and may include, for example, laser-based scanners that emit laser light to scan a bar code and optical-type scanners that essentially capture electronic images of a barcode. Such scanners are often integrated with a weighing scale. In some embodiments, such a combination scale/scanner device may include an enclosure that extends upward from a POS countertop to house the scale and scanner components. In other embodiments of such a device, the majority of the scale/scanner may be recessed within a cutout that is located in the POS countertop, such that typically only a portion of the scale platter and a scanner viewing window are visible to the user.

As would also no doubt be a familiar process, such a scale/scanner device is generally used to weigh and/or scan products purchased at the POS location. For example, the scanner may be used alone to scan the barcode of items that do not require weighing. In the case of an item that does require weighing prior to purchase, the scale portion of the scale/scanner device may be used alone (generally, along with some sort of electronic item lookup), or the scanner may be used to scan a barcode associated with the item and then the scale may be used to determine the weight of the item in order to determine the item price.

When installing a new scale/scanner device in a recessed retrofit application, or even in a new application, the cutout into which the scale/scanner device will be installed generally determines the size of the scanner (and the associated viewing window) that may be used—as scanners of different sizes are frequently usable with a given scale. Because such scanners are typically directional in the sense that they emit (scan) or image capture in the direction of an arriving item, the scanner of such a scale/scanner device may also need to be oriented differently in different applications. Further, since the scan pattern emitted by such a scanner or the imaging field of view of such a scanner is directed at an angle (i.e., not perpendicular to the overlying scanner window), placement of a scanner with respect to the scanner window may also be important in order to optimize the through-window scanning area.

There has heretofore been no efficient way of installing different scanners into a given scale/scanner enclosure or altering the orientation of a scanner with respect to a given scale/scanner. To accomplish either task with respect to known scale/scanner devices, one would need to use various tools and to go through the time consuming task of removing existing scanner support hardware and installing new hardware in its place. Consequently, a better solution to accomplishing one or both of said tasks is needed. System and method embodiments of the invention meet this need.

BRIEF SUMMARY

System and method embodiments of the invention permit a variety of scanners to be easily and quickly installed into a given scale/scanner device, and at different orientations. Such scanners may include, without limitation, laser-based scanners that emit laser light to scan a bar code and optical-type scanners that essentially capture electronic images of a barcode. Optical-type scanners are now also frequently being referred to in the art as "imagers", and for purposes of the present application, the term "scanner" or "scanners" is intended to include laser-based scanners, optical-type scanners/imagers, and any other bar code reading device that might be reasonably installed in combination with a scale. Similarly, the specific location and/or orientation of the scanner within the scale/scanner device enclosure may be simply adjusted, and an existing scanner may be removed and replaced with a new or different scanner with little effort. Furthermore, in at least some embodiments, any of these aforementioned actions may be accomplished without the use of tools.

Various scale/scanner device embodiments will generally include a device housing that may serve, among other things, as a mounting frame for suspending or otherwise locating the scale/scanner device in a support surface (e.g., counter) cutout, as an enclosure for containing and retaining components of the scale, and as a support and retention surface for scanner mounting assembly embodiments according to the invention. Such housings may be of various shape, size and construction. The design of the scale portion of the scale/scanner device may also be of various design and construction.

Generally speaking, scanner mounting assembly embodiments of the invention will include cooperating and adjustable sets of mounting rails that act to support and locate a scanner of a given scale/scanner device. A first mounting rail set includes, in some exemplary embodiments, a pair of mounting rails that are affixed to opposite inner walls of the scale/scanner device housing or that form a portion of opposite walls of the scale/scanner device housing. A second mounting rail set includes, in one exemplary embodiment, a pair of mounting rails that substantially transversely extend between the first mounting rail set and are connected thereto in a manner that allows the position of the second mounting rail set with respect to the first mounting rail set to be easily adjusted. For example, the second mounting rail set may be slidable along the length of the first mounting rail set such that the position thereof along the first mounting rail set may be adjusted, as may be the spacing between the second mounting rail set.

The aforementioned first and second set of mounting rails cooperatively function to position a scanner laterally within the scale/scanner device housing (i.e., along a typically planar X-Y axis that is usually substantially parallel to the scanner window). In some embodiments, the length of the first and second sets of mounting rails may be fixed. In other embodiments, the length of the first and/or second sets of mounting rails may be adjustable. For example, in certain embodiments, the lengths of the mounting rails of the second mounting rail set may be adjustable so as to span the width or length of different scale/scanner device enclosures.

In some embodiments, scanner position may also be adjustable along a third (i.e., Z) axis that is substantially perpendicular to the axes of adjustment provided by the first and second sets of mounting rails. That is, in some embodiments, the position of a scanner may also be adjusted along an axis that allows the scanner to be located closer to or farther away from the scanner window. Various embodiments of third axis position adjustment mechanisms may be employed in this regard. Such third axis position adjustment mechanisms may be provided in conjunction with the two axis positioning capability already mentioned above, thereby providing for full, three axis scanner position adjustability.

The mounting rails of scanner mounting assembly embodiments of the invention may be affixed to a scale/scanner housing and to each other in various ways. For example, in more simplistic embodiments, such affixation may be accomplished using threaded fasteners. In other exemplary embodiments, affixation of at least the second mounting rail set may be accomplished by means of spring-loaded rail retention mechanisms that releasably and adjustably maintain the position of the second mounting rail set on the first mounting rail set. Consequently, the position of either or both mounting rails of the second mounting rail set may be adjusted along the length of the first mounting rail set by simply manipulating a pin element of the spring-loaded rail retention mechanisms and moving the rail(s) of the second mounting rail set to a desired location.

As with the mounting rails, a scanner may be removably located within a scanner mounting assembly of the invention in several ways. For example, in certain embodiments, the scanner may include or be associated with mounting hardware that is secured to the second set of rails and/or the first set of rails with threaded fasteners. In at least certain exemplary embodiments, however, each rail of the second set of rails includes an upstanding wall along its outer long edge, which serves to act as a locator and as a stop against scanner movement along a first axis of the scale/scanner device when the rails of the second mounting rail set are properly spaced. Additionally, in such exemplary embodiments, each rail of the second mounting rail set is equipped with a pair of spring-loaded scanner locating mechanisms that may be similar in design to the spring-loaded rail retention mechanisms. The spring-loaded scanner locating mechanisms include stop elements and are slidable within slots that extend in the length direction of each rail of the second set of rails. Consequently, when properly located, the spring-loaded scanner retention devices may be spaced apart so as to act as stops against scanner movement along a second axis of the scale/scanner device. Similar spring-loaded retention devices may also be used to releasably secure the position of a third axis adjustment mechanism, when present.

Other aspects and features of the invention will become apparent to those skilled in the art upon review of the following detailed description of exemplary embodiments along with the accompanying drawing figures.

BRIEF DESCRIPTION OF THE DRAWINGS

In the following descriptions of the drawings and exemplary embodiments, like reference numerals across the several views refer to identical or equivalent features, and:

FIG. 8 depicts the third axis adjustment mechanism of FIGS. 7A-7B being used to mount an exemplary scanner to an exemplary scale/scanner device;

FIGS. 9A-9B illustrate different positions of another exemplary embodiment of a third axis adjustment mechanism of an exemplary scanner mounting assembly of the invention.

DETAILED DESCRIPTION OF THE EXEMPLARY EMBODIMENTS

Figure 1:
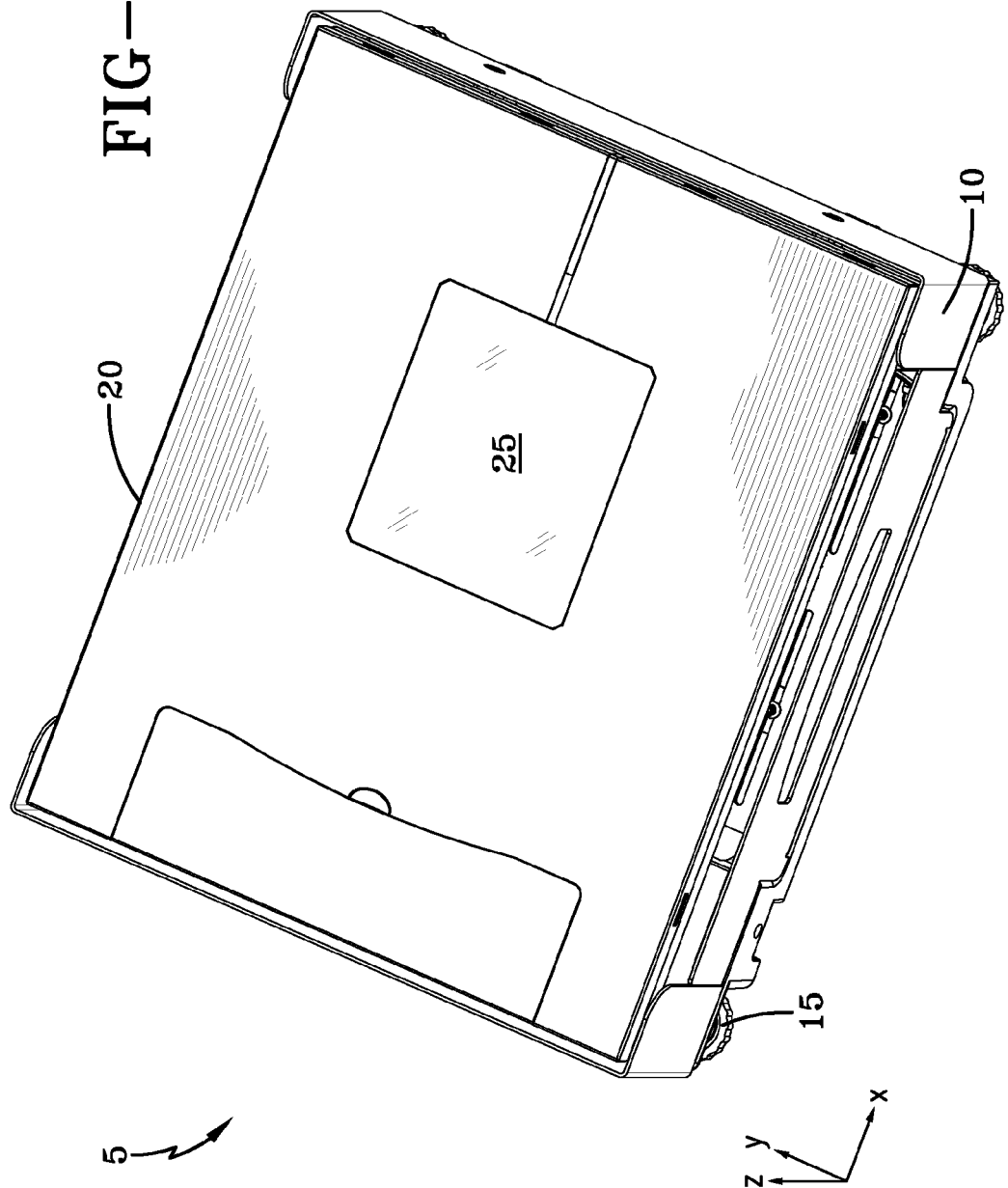
FIG. 1 is a perspective view of one exemplary scale/scanner device that employs an exemplary scanner mounting assembly of the invention.

Depicted in FIG. 1 is one exemplary embodiment of a recessed installation type scale/scanner device 5 to which scanner mounting assembly embodiments of the invention may be installed. As shown, this particular scale/scanner device 5 includes a housing 10, with leveling feet 15 located along a bottom surface thereof. A scale platter 20 that includes a glass scanner viewing window 25 forms a top surface of the scale/scanner device 5. In use, items having bar codes to be scanned are passed over the scanner window 25 for scanning by a subjacent scanner (not shown), while items to be weighed are placed on the scale platter 20 that typically rests on load cells or some other weighment element(s), as is well known in the art and generally described above.

Figure 2:
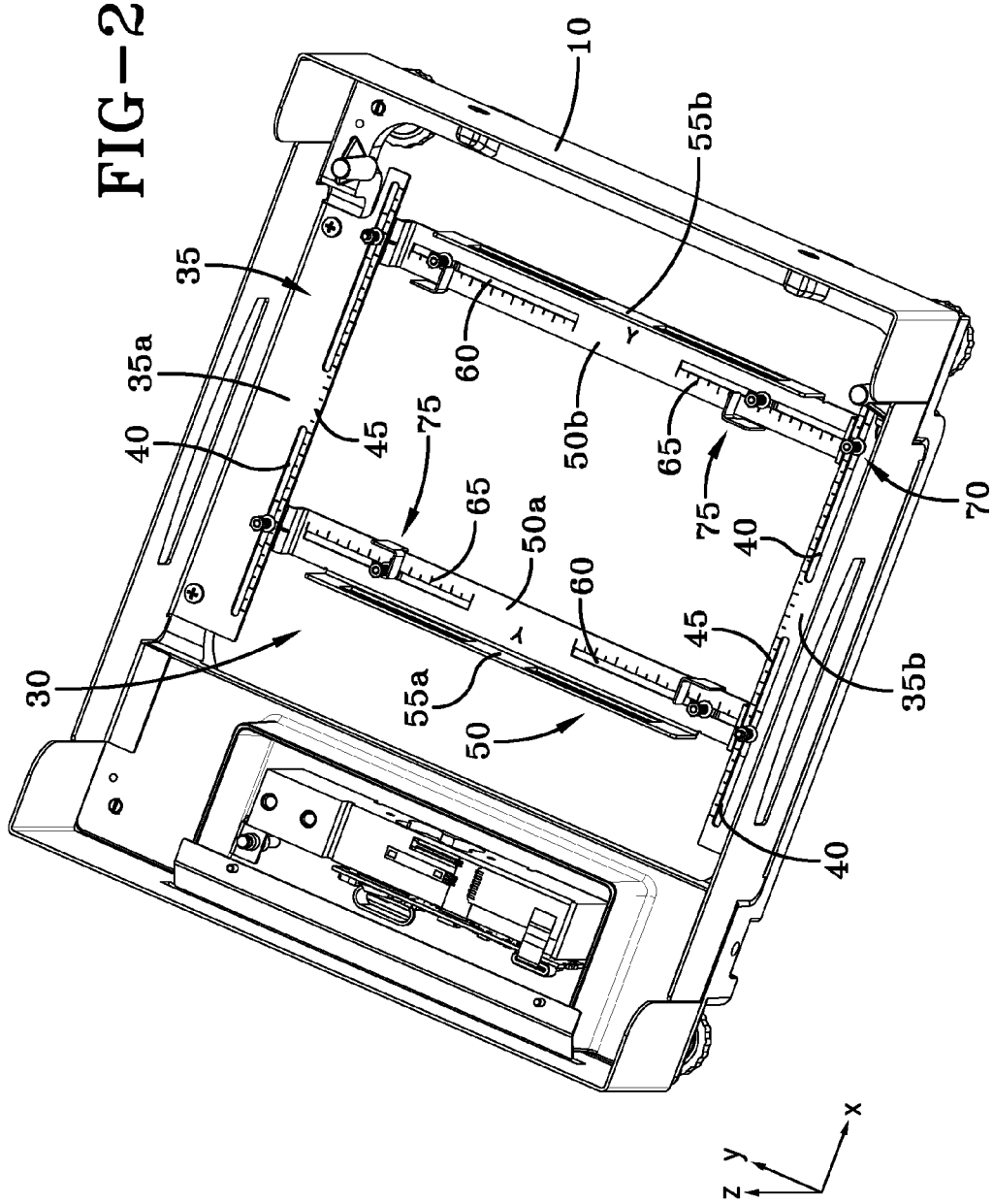
FIG. 2 is a cross-sectional view of the scale/scanner device of FIG. 1 taken along the indicated section line.

A section view of the scale/scanner device 5 of FIG. 1 is illustrated in FIG. 2. The view of FIG. 2, as well as the views provided by FIG. 3 and FIG. 4, reveal one exemplary embodiment of a scanner mounting assembly 30 that is located within the housing 10. The scanner mounting assembly 30 can be seen to include a first mounting rail set 35 which, in this embodiment, includes a pair of rails 35a, 35b that each form a portion of opposite walls of the scale/scanner device housing 10. In other embodiments, the rails of the first set of rails may simply attach to the device housing rather than form a part thereof.

Each rail 35a, 35b of the first mounting rail set 35 includes elongated slots 40 that extend along the length direction thereof. The slots 40 are provided for connecting a second mounting rail set (see below) between the first mounting rail set 35. In other embodiments, the slots 40 may be replaced with a single slot or with a series of separate holes that provide multiple connection points for a second mounting rail set.

Each rail 35a, 35b of this particular first mounting rail set 35 also includes optional graduated scale markings 45 along its length. As described in more detail below, the scale markings 45 allow the second mounting rail set to be properly located along the first mounting rail set 35.

The scanner mounting assembly 30 also includes a second mounting rail set 50 which, in this embodiment, includes a pair of rails 50a, 50b that extend substantially perpendicularly between the rails 35a, 35b of first mounting rail set 35. Each rail 50a, 50b of the second mounting rail set 50 also includes an upstanding scanner retention wall 55a, 55b. The walls 55a, 55b serve to locate and prevent movement of a scanner along one axis of the scale/scanner device 5 when the scanner is installed to the scanner mounting assembly 30 and the mounting rails 50a, 50b are properly spaced.

Each rail 50a, 50b of the second mounting rail set 50 also includes elongated slots 60 that extend along the length direction thereof. The slots 60 are provided for engaging scanner locating mechanisms 75, exemplary embodiments of which are described in more detail below. In other embodiments, the slots 60 may be replaced with longer single slots.

Each rail 50a, 50b of this particular first mounting rail set 50 also includes optional graduated scale markings 65 along the slots 60 located therein. As described in more detail below, the scale markings 65 allow the scanner locating mechanisms 75 to be properly located along the second mounting rail set 50 based on the particular scanner to be mounted.

Although the rails 50a, 50b of the second mounting rail set 50 may be secured to the first mounting rail set 35 using rail retention devices in the form of threaded or other suitable fasteners, this exemplary embodiment of the scanner mounting assembly 30 employs spring-loaded rail retention devices 70 for this purpose. Similarly, while the scanner locating mechanisms could be mounted to the second rails 50a, 50b of the scanner mounting assembly 30 with scanner locating mechanism retention devices in the form of threaded or other suitable fasteners, this exemplary embodiment of the scanner mounting assembly employs spring-loaded retention pin devices 80 for this purpose. Therefore, the scanner locating mechanisms 75 may be thought of as being spring loaded.

Figure 3:
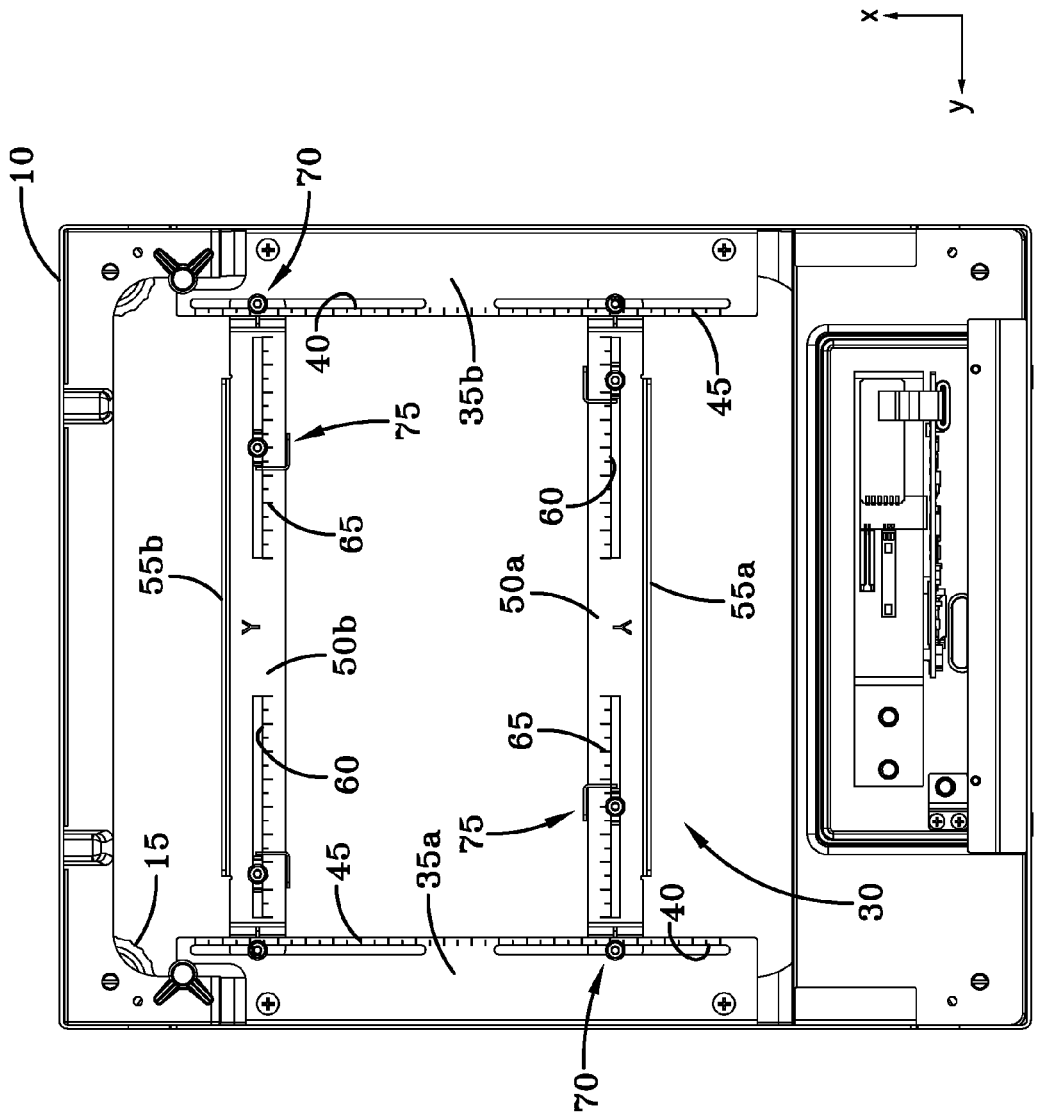
FIG. 3 is a top plan view of the scale/scanner device and scanner mounting assembly of FIG. 1.
Figure 4:
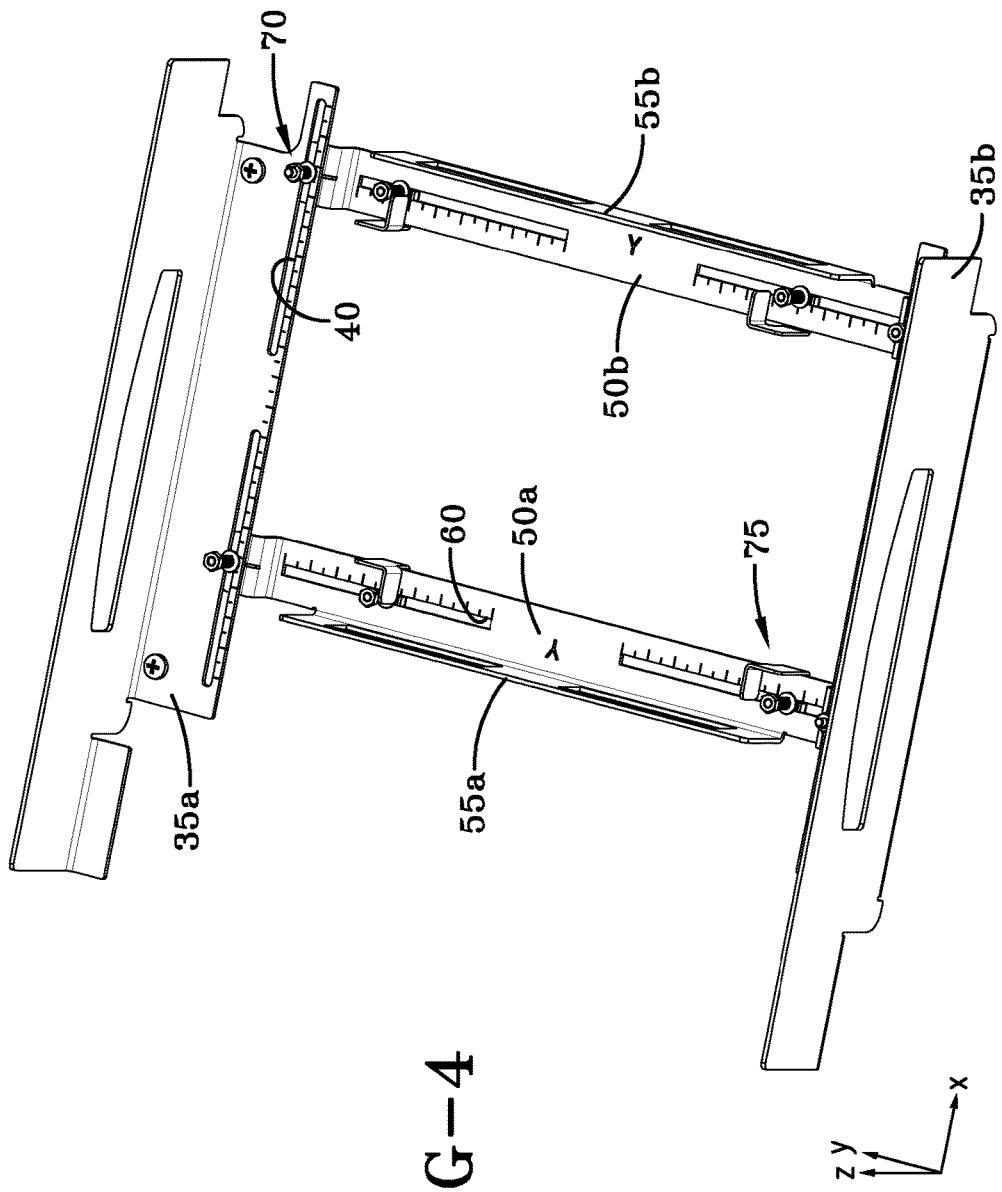
FIG. 4 is a perspective view of the scanner mounting assembly of FIG. 1, with the remainder of the scale/scanner device removed for clarity.
Figure 5B:
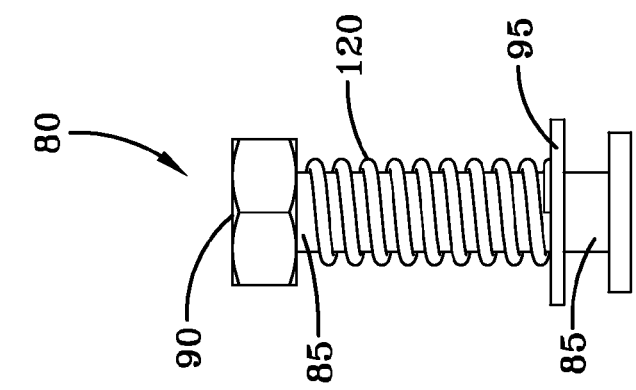
FIG. 5B shows the same but with a stop element removed for clarity.
Figure 5A:
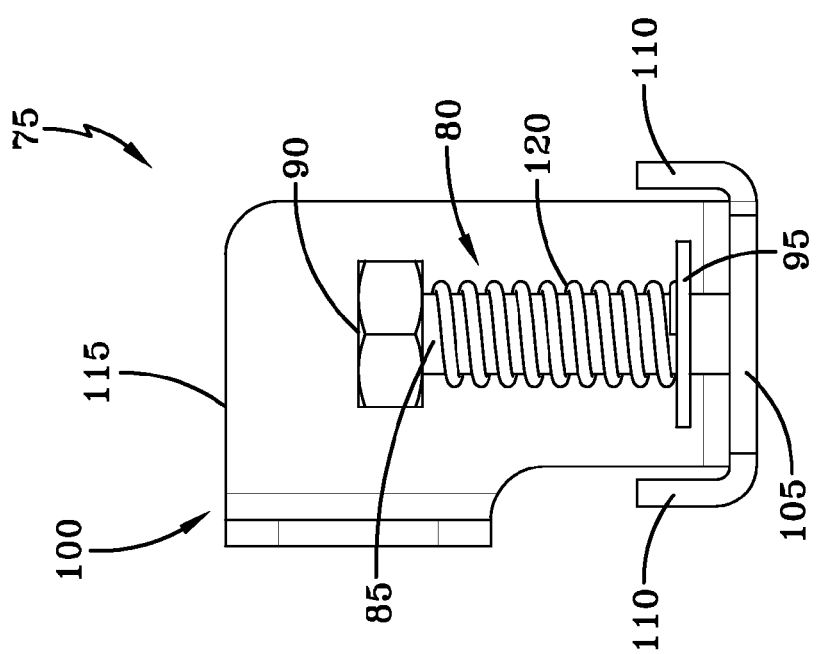
FIG. 5A is an enlarged elevation view of an exemplary spring-loaded scanner locating mechanism.

An enlarged view of the exemplary spring-loaded scanner locating mechanisms 75 shown in FIGS. 2-4 is provided in FIG. 5A. The spring-loaded scanner locating mechanism 75 can be observed to include a spring-loaded retention pin device 80 and an associated scanner stop element 100. An enlarged view of the spring-loaded retention pin device 80 is shown in FIG. 5B.

This exemplary embodiment of the spring-loaded retention pin device 80 includes a pin 85 having an upper spring retainer 90. A lower portion of the pin 85 passes through an optional lower spring retainer/upper clamping element 95. In other embodiments, the upper surface of the second rail 55a, 55b surrounding the slot 60 may act as the lower spring retainer. In this embodiment, a portion of the pin 85 extends through the upper clamping element 95 and is connected to a base leg 105 of the associated scanner stop element 100, such as by threading, welding, etc.

Although not shown in FIG. 5A for purposes of clarity, it can be understood from FIGS. 2-4 that when the spring-loaded scanner locating mechanism 75 is installed to a slot 60 in one of the rails 50a, 50b of the second mounting rail set 50, the rail resides between the upper clamping element 95 and the base leg 105 of the scanner stop element 100. The pin 85 also passes through a spring 120, which is trapped between the upper spring retainer 90 of the spring-loaded retention pin device 80 and the upper clamping element 95 (or the rail in other embodiments). The spring exerts an upward force on the upper spring retainer 90 of the spring-loaded retention pin device 80 that pulls the base leg 105 of the scanner stop element 100 tightly against the underside of the second rail 50a, 50b to which the spring-loaded scanner locating mechanism is installed, while simultaneously exerting a downward force against the upper clamping element 95 (or directly against the rail 50a, 50b). Consequently, the spring-loaded scanner locating mechanism 75 is held securely to the rail 50a, 50b by the extension force of the spring 120.

This exemplary scanner stop element 100 is also shown to include a pair of upwardly extending guide legs (tabs) 110 that are sized to pass through the slots 60 in the rails 50a, 50b of the second mounting rail set 50. The guide tabs 110 help to guide the spring-loaded scanner locating mechanism 75 along the mounting rails when the position thereof is adjusted.

This exemplary scanner stop element 100 is further shown to include an upwardly extending locating tab 115. The locating tab 115 extends from the base leg 105 and functions to serve as a hard stop to scanner movement when spring-loaded scanner locating mechanism 75 is properly positioned on the rails 50a, 50b of the second mounting rail set 50 and secured thereto by the spring-loaded retention pin device 80.

Figure 6:
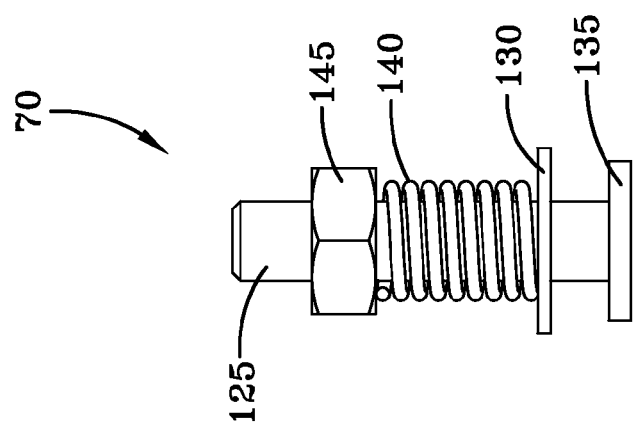
FIG. 6 is an enlarged elevation view of an exemplary spring-loaded rail retention mechanism.

An enlarged view of the exemplary spring-loaded rail retention mechanisms 70 shown in FIGS. 2-4 is provided in FIG. 6. The spring-loaded rail retention mechanisms 70 can be observed to include a pin 125, which may be a threaded fastener. A lower portion of the pin 125 passes through an optional upper clamping element 130. A portion of the pin 125 extends beyond the upper clamping element 130 and is connected to the associated lower clamping element 135, such as by threading, welding, etc. A spring 140 surrounds the pin 125 and is trapped between the upper clamping element 130 and an upper spring retainer 145, such as a nut that is fixed to the pin.

Although not shown in FIG. 6 for purposes of clarity, it can be understood from FIGS. 2-4 that when the spring-loaded rail retention mechanism 70 is used, a portion of the pin passes through the slot 40 in the rails 35a, 35b of the first mounting rail set 35 and through a slot or hole near the ends of the rails 50a, 50b of the second mounting rail set 50. Further, the rails 35a, 35b of the first mounting rail set 35 as well as the rails 50a, 50b of the second mounting rail set 50 both reside between the upper clamping element 130 and the lower clamping element 135. The spring 140 exerts an upward force on the upper spring retainer 145, which pulls the lower clamping element 135 tightly against the underside of the rail 50a, 50b of the second mounting rail set 50, while simultaneously exerting a downward force against the upper clamping element 130 or directly against the rail 35a, 35b of the first mounting rail set 35. As such, a rail 50a, 50b of the second mounting rail set 50 may be held securely in position between the rails 35a, 35b of the first mounting rail set 50 by the extension force of the spring 140.

It should be noted that neither use of the spring-loaded scanner locating mechanism 75 or the spring-loaded rail retention mechanism 70 requires the use of any tools. Rather, a user need only to depress the pin and compress the spring of said mechanisms to release the clamping force and move the rails 50a, 50b or the spring-loaded scanner locating mechanisms 75.

Referring again to FIGS. 2-4, it is also noted that the optional graduated scale markings 45 provided on the rails 35a, 35b of the first mounting rail set 35 may be used to easily and properly position the rails 50a, 50b of the second mounting rail set 50 to receive and locate a given scanner along a first axis of the scale/scanner device 5. Similarly, the optional graduated scale markings 65 provided on the rails 50a, 50b of the second mounting rail set 50 may be used to easily and properly position the spring-loaded scanner locating mechanisms 75 to locate a given scanner along an axis of the scale/scanner device 5 that is substantially perpendicular to the first axis. In this regard, the location points for the rails 50a, 50b of the second mounting rail set 50 and also the positions for the spring-loaded scanner locating mechanisms 75 may be predetermined for a given scale and provided to coincide with particular ones of the graduated markings 45, 65. In one example, a specified Y-axis location of "3" for a particular scanner would indicate that each spring-loaded scanner locating mechanism 75 is to be set at the graduated marking 65 on the rails 50a, 50b of the second mounting rail set 50 that is labeled "3". In another example, the same Y-axis location (and graduated marking 65) may be used to set the proper second rail set location for only some of the spring-loaded scanner locating mechanisms 75. In yet another example, each of the spring-loaded scanner locating mechanisms 75 may be properly set to a different Y-axis/ second rail set location (and graduated marking 65). These variations allow for the mounting of scanners of different dimension and also of irregular (non-uniform) shape. The proper Y-axis location settings for the spring-loaded scanner locating mechanisms 75 of a given device may be called out, for example, in a service or installation manual, and/or in other locations.

Because the positions of the rails 50a, 50b of the second mounting rail set 50 are adjustable along the rails 35a, 35b of the first mounting rail set 35, and because the positions of the spring-loaded scanner locating mechanisms 75 are adjustable along the length of the rails 50a, 50b of the second mounting rail set 50, it should be apparent that a scanner may be installed within the scale/scanner housing 10 at any of four different orientations. Particularly, a scanner may be installed with a given end thereof facing either of the rails 35a, 35b or 50a, 50b. Depending on the particular scanner, this may be generally thought of as two different portrait orientations and two different landscape orientations. Additionally, because of the adjustability of the rails 50a, 50b of the second mounting rail set 50 and the adjustability of the spring-loaded scanner locating mechanisms 75, a scanner may be located other than at the center of the housing 10. That is, the overall location of the scanner within the scale/scanner device housing 10 may also be adjusted. Consequently, it may be easily understood that a scanner mounting mechanism of the invention facilitates the installation of a variety of different possible scanners and may also allow such installation to be accomplished in an easy and efficient manner, and without tools.

In addition to the 2-dimensional (X-Y axes) scanner placement adjustability described above, it is also possible in certain embodiments to provide for position adjustment in a third dimension. In the particular exemplary embodiments disclosed herein, this third axis is referred to purely for purposes of illustration as the Z-axis.

Figure 7A:
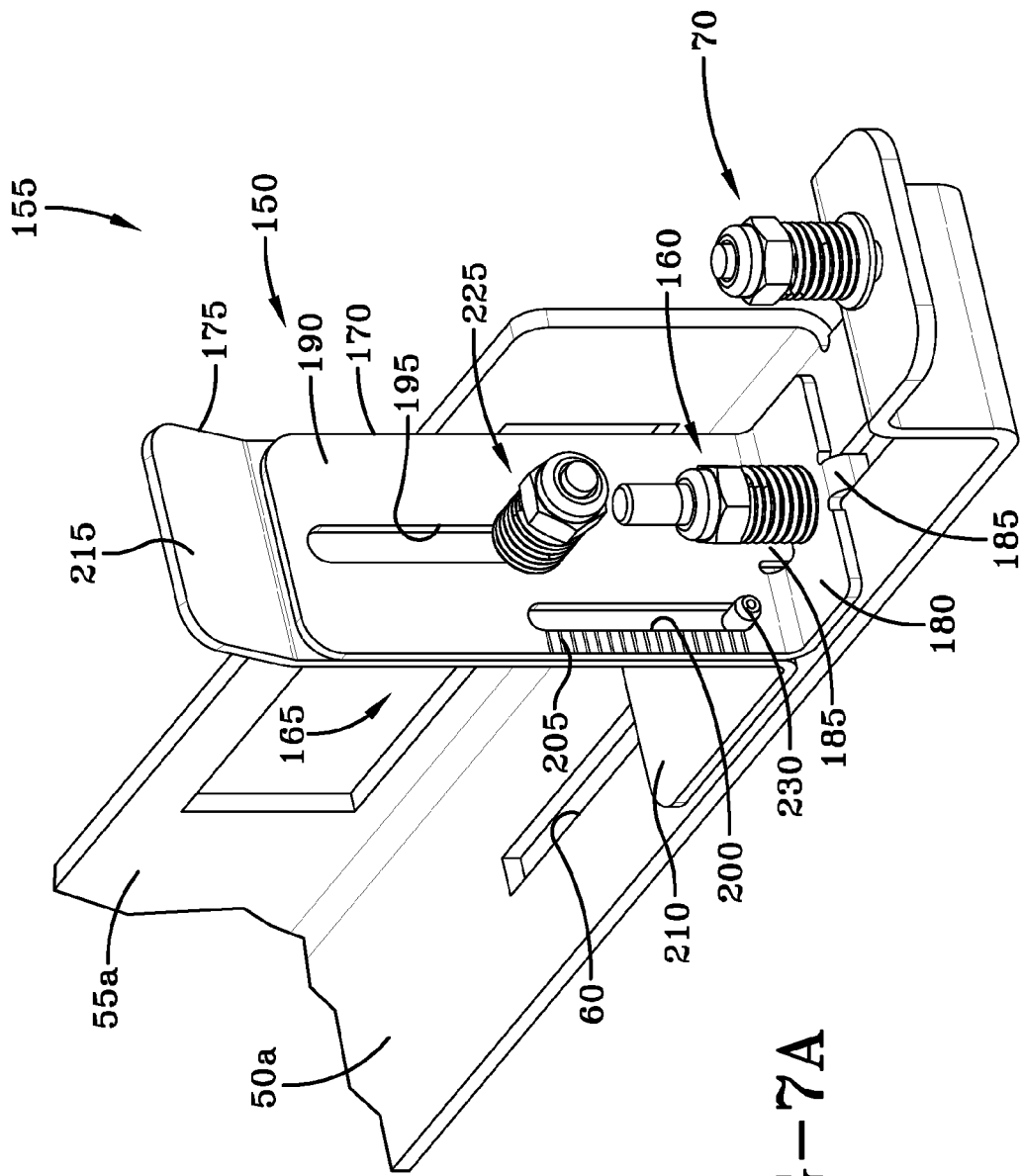
FIGS. 7A-7B illustrate different positions of one exemplary embodiment of a third axis adjustment mechanism of an exemplary scanner mounting assembly of the invention.
Figure 7B:
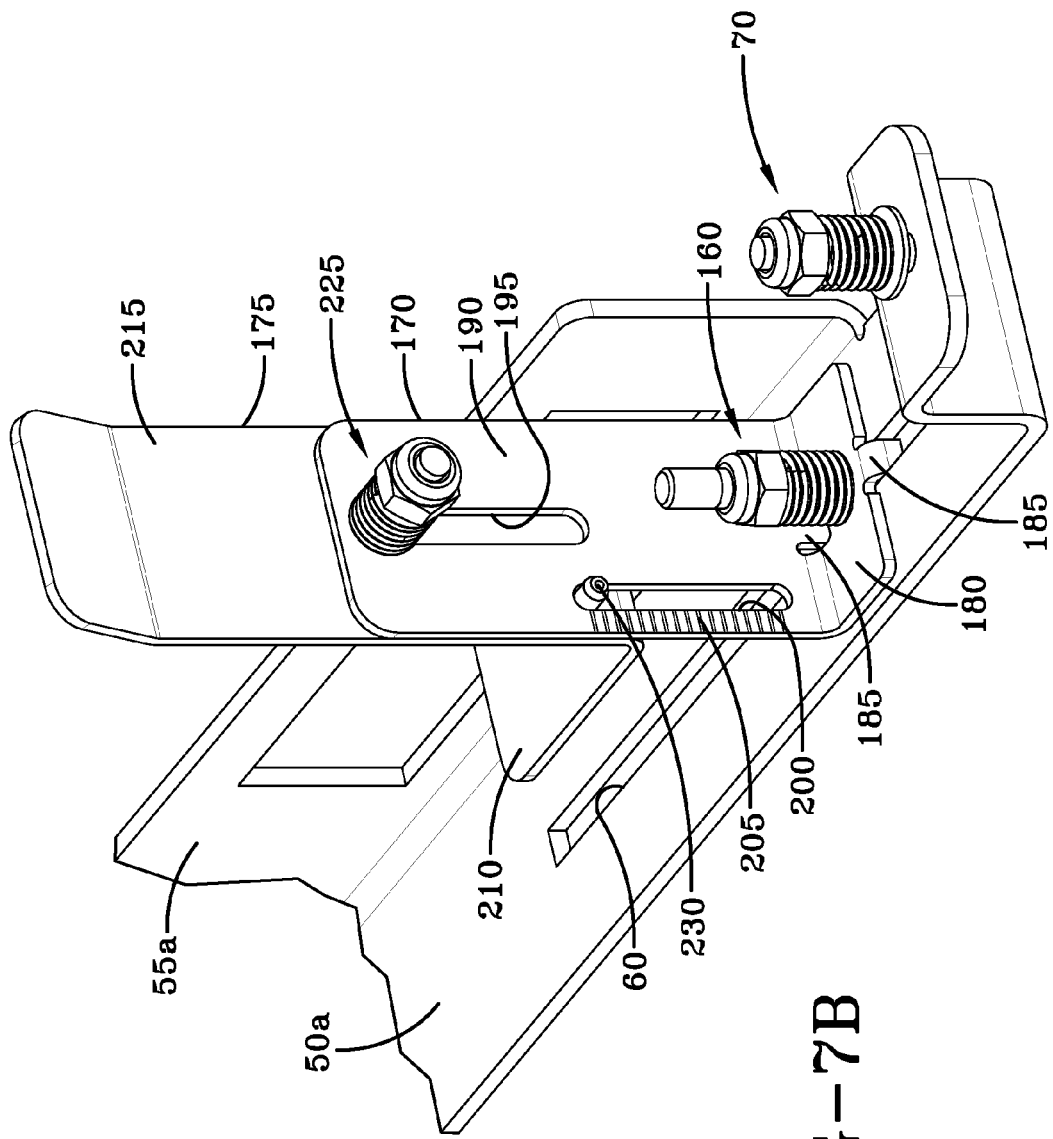

One exemplary embodiment of a third axis adjustment mechanism 150 that may form a part of an exemplary scanner mounting assembly embodiment of the invention is depicted in FIGS. 7A-7B. As shown, this particular exemplary third axis adjustment mechanism 150 accomplishes a third axis positional adjustment of a scanner 235 (see FIG. 8) by altering the third-axis position of the spring-loaded scanner locating mechanisms 155 that are used to otherwise locate the scanner in the other two dimensions (as described above).

More specifically, the spring-loaded scanner locating mechanisms 155 of this embodiment are designed to locate a scanner in all three dimensions (X, Y, Z). In a manner similar to that of the previously-described spring-loaded scanner locating mechanism embodiment 75, this exemplary spring-loaded scanner locating mechanism 155 includes a spring-loaded retention pin device 160 and an associated scanner stop element 165. The spring-loaded retention pin device 160 may have a construction and operation that is the same as or similar to the spring-loaded rail retention mechanisms 70 described above with respect to FIG. 6. Unlike the previously-described spring-loaded scanner locating mechanism embodiment 75, however, the scanner stop element 165 of this exemplary third axis adjustment mechanism 150 is of multi-piece construction and also facilitates third axis positional adjustment of a scanner.

As shown in FIGS. 7A-7B, the scanner stop element 165 includes a rail engaging component 170 and a scanner support component 175. The rail engaging component 170 is releasably securable to the rail 50a, 50b of a second mounting rail set 50. The scanner support component 175 is releasably securable to the rail engaging component 170 in a manner that permits the position of the scanner support component with respect to the rail engaging component to be slidably adjusted in the third axis direction.

The rail engaging component 170 of this exemplary scanner stop element 165 is shown to include a base leg 180 that slides along the top surface of a rail 50a, 50b of the second mounting rail set 50, and a pair of guide legs (tabs) 185 that extend downward from the base leg and are sized to pass through the slots 60 in the rails of the second mounting rail set so as to help guide the spring-loaded scanner locating mechanism 155 along the mounting rails when the position thereof is adjusted.

The rail engaging component 170 of this exemplary scanner stop element 165 also includes an upwardly-extending scanner support component mounting tab 190 that extends from the base leg 180 and functions as a mounting and support surface for the scanner support component 175. To this end, the exemplary scanner support component mounting tab 190 of this exemplary rail engaging component 170 includes at least one scanner support component mounting and adjusting slot 195. As shown in FIGS. 7A-7B, an optional position indicator slot 200 may also be located in the scanner support component mounting tab 190 for indicating the third axis position of the scanner support component 175. In this regard, a graduated scale 205 or some other position indication markings may be located on the face of the scanner support component mounting tab 190 in the area of the position indicator slot 200, when present.

The exemplary embodiment of the scanner support component 175 depicted in FIGS. 7A-7B is similar to the rail engaging component 170 in that it includes a base leg 210 and a stop tab 215 that extends upwardly therefrom. A top surface of the base leg 210 of the scanner support component 175 serves to contact and support the underside of a scanner, while the bottom surface may slide along the top surface of a rail 50a, 50b of the second mounting rail set 50 when the third axis adjustment mechanism 150 is in its lowermost position. The upwardly-extending stop tab 215 of the scanner support component 175 serves as a hard stop to lateral/horizontal (Y axis) movement of a scanner along the rails 50a, 50b of the second mounting rail set 50 when the spring-loaded scanner locating mechanisms 155 are properly positioned thereon and secured thereto by the spring-loaded retention pin devices 160.

In order to adjustably secure the scanner support component 175 to the rail engaging component 170 of the scanner stop element 165, this exemplary scanner support component includes a hole 220 (FIG. 8) that is aligned with the scanner support component mounting and adjusting slot 195 of the rail engaging component when the two components are properly positioned with respect to one another. The scanner support component mounting and adjusting slot 195 and the hole 220 in the scanner support component 175 cooperatively permit the passage therethrough of a third axis retention device, which may be a threaded fastener or, as shown here, a spring-loaded retention pin device 225. The spring-loaded retention pin device 225 may be a spring-loaded device of the same or similar construction as the scanner locating mechanism retention pin device 160. The third axis retention pin device 225 functions to releasably and adjustably secure the scanner support component 175 to the rail engaging component 170 at any of various positions along the length of the scanner support component mounting and adjusting slot 195, by exerting a releasable spring-provided clamping force that holds the scanner support component and the rail engaging component tightly together unless deliberately released to reposition the scanner support component.

An indicating element may be optionally associated with the scanner support component 175 for the purpose of indicating the third axis position of the scanner support component and a scanner supported thereby. In the exemplary embodiment of FIGS. 7A-7B, the indicating element is an indicator pin 230 that extends from the upwardly-extending tab 215 of the scanner support component 175 so as to protrude through the position indicator slot 200 of the scanner support component mounting tab 190 and to align with a given marking of the graduated scale 205. In this manner, the third axis position of the scanner support component 175 may be easily ascertained as the scanner support component is placed in different third axis positions. Other scanner support component 175 and scanner third axis position indication means may be employed in other embodiments.

Referring now particularly to FIG. 7A, a lowermost position of the scanner support component 175 of this particular exemplary embodiment of the third axis adjustment mechanism 150 may be observed. As shown, in this position, a bottom surface of the base leg 210 of the scanner support component 175 rests on or is adjacent the top surface of a rail 50a, 50b of the second set of rails 50. Consequently, the third axis retention pin device 225 is at or near the bottom of the scanner support component mounting and adjusting slot 195 and the indicator pin 230 is at or near the bottom of the position indicator slot 200 in the scanner support component mounting tab 190 and aligned with the lowermost one of the graduated markings 205. It should be realized that the particular relationship of elements in the exemplary embodiment of the spring-loaded scanner locating mechanism 155 and associated third axis adjustment mechanism 150 of FIG. 7A is shown and described only for purposes of illustration, and the exact relationship of the various elements may be different in other embodiments.

Referring now particularly to FIG. 7B, an uppermost position of the scanner support component 175 of this particular exemplary embodiment of the third axis adjustment mechanism 150 may be observed. As shown, in this position, the base leg 210 of the scanner support component 175 is raised some distance above the top surface of the rail 50a, 50b of the second set of rails 50. Consequently, the third axis retention pin device 225 is at or near the top of the scanner support component mounting and adjusting slot 195 and the indicator pin 230 is at or near the top of the position indicator slot 200 in the scanner support component mounting tab 190 and aligned with the uppermost one of the graduated markings 205. It should be realized that the particular relationship of elements in the exemplary embodiment of the spring-loaded scanner locating mechanism 155 and associated third axis adjustment mechanism 150 of FIG. 7B is shown and described only for purposes of illustration, and the exact relationship of the various elements may be different in other embodiments.

The spring-loaded scanner locating mechanism 155 and associated third axis adjustment mechanism 150 of FIGS. 7A-7B is depicted in a scanner supporting function in FIG. 8. As shown, the mounting end of the rail 50a of the second set of rails 50 has been releasably affixed to the rail 35a of the first set of rails 35 by a spring-loaded rail retention device 70, as was previously described. Similarly, the position of the spring-loaded scanner locating mechanism 155 along the length of the rail 50a has been secured by the spring-loaded retention pin device 160, as also previously described above. Consequently, the upwardly-extending tab 215 of the scanner support component 175 serves as a hard stop to lateral/horizontal (Y axis) movement of a scanner 235 along the length of the rail 50a. As would be understood from the previous description of exemplary embodiments, other spring-loaded scanner locating mechanisms 155 would also be used as necessary to secure the desired location of the scanner along the rails 50a, 50b of the second set of rails 50.

As shown in FIG. 8, the scanner support component 175 and the scanner 235 are set at a lowermost position. If it is desired to raise the scanner position, the third axis retention pin device 225 is operated by a user to release the exerted clamping force and the scanner support component 175 is slid upward along the scanner support component mounting tab 190 of the rail engaging component 170 until the desired third axis position is reached. As with the positions of the exemplary spring-loaded scanner locating mechanisms 75, 155 described herein, a proper third axis position for a given scanner may be indicated in a service manual, etc., by way of a graduated marking callout or a similar position indication callout. For example, a proper third axis position for the scanner 235 may coincide with a third axis position of the scanner support component 175 that results in the indicator pin 230 being aligned with a graduated marking 205 designated by a given numeral, etc. The scanner support components 175 of the other spring-loaded scanner locating mechanism third axis adjustment mechanisms 150 may be set to the same third axis positions to achieve a substantially level scanner orientation, or different third axis positions may be employed to place the scanner on an angle with respect to the overlying scanner window 25.

An alternative embodiment of a scanner locating third (Z) axis adjustment mechanism 250 is depicted in FIGS. 9A-9B. As with the spring-loaded scanner locating mechanism 155 and associated third axis adjustment mechanism 150 of FIGS. 7A-7B, this embodiment of the third axis adjustment mechanism 250 may form a part of an exemplary scanner mounting assembly embodiment of the invention.

In combination with previously described embodiments of spring-loaded scanner locating mechanisms, the third axis adjustment mechanisms 250 of this embodiment are again designed to locate a scanner in all three dimensions (X, Y, Z). However, unlike the exemplary embodiment of FIGS. 7A-7B, this exemplary third axis adjustment mechanism 250 is not part of a X-Y (lateral) axis scanner locating (stop) mechanism and also includes a modified second rail set.

More specifically, as shown in FIGS. 9A-9B, a rail 255a of a second rail set (complimentary rail not shown) is shown to include an upwardly bent mounting end 260. The upwardly bent mounting end 260 of the second rail 255a is adapted to includes a rail support component mounting and adjusting slot 265, that facilitates the releasable mounting thereto of a rail support component 275 in a manner that permits the position of the second rail 255a with respect to the rail support component to be slidably adjusted in the third axis direction. The upwardly bent mounting end 260 of the second rail 255a may also include an optional position indicator slot 270 for indicating the third axis position of the rail support component 275. In this regard, a graduated scale 280 or some other position indication markings may be located on the face of the upwardly bent mounting end 260 of the second rail 255a in the area of the position indicator slot 270, when present.

The rail support component 275 of this exemplary third axis adjustment mechanism 250 is shown to include a base leg 285 that is slidable along the top or a bottom surface of a first rail 35a, 35b of a first mounting rail set 35, as well as a second rail mounting tab 290 that extends upwardly from the base leg 285 and functions as the mounting surface for releasably mounting the rail support component 275 to the upwardly bent mounting end 260 of the second rail 255a. In operation, the rail support component 275 is attached to the a first rail 35a, 35b of a first mounting rail set 35 by the base leg 285, and to the upwardly bent mounting end 260 of the second rail 255a by way of the second rail mounting tab 290.

The rail support component 275 is slidable along the length of a first rail 35a, 35b in the same manner as the mounting end of a second rail 50a, 50b of the adjustable scanner mounting assembly embodiments described above with respect to FIGS. 2-4. As such, a spring-loaded rail support component retention device 295 may pass through the base leg 285 of the rail support component 275 and through the slot 60 in a first rail 35a, 35b. The spring-loaded rail support component retention device 295 may function to releasably secure a given position of the rail support component 275 on a first rail 35a, 35b in the same or a similar manner as the spring-loaded rail retention devices 70 of FIGS. 2-4 and FIG. 6 and the spring-loaded retention pin devices 160 of FIGS. 7A-7B and FIG. 8.

In order to adjustably secure the rail support component 275 to the upwardly bent mounting end 260 of the second rail 255a, this exemplary rail support component includes a hole (not visible) that is aligned with the rail support component mounting and adjusting slot 265 of the upwardly bent mounting end of the second rail when the two components are properly positioned with respect to one another. The rail support component mounting and adjusting slot 265 and the hole in the rail support component 275 cooperatively permit the passage therethrough of a third axis retention pin device 300. Generally speaking, the third axis retention pin device 300 functions to releasably and adjustably secure the rail support component 275 to the upwardly bent mounting end 260 of the second rail 255a at any of various positions along the length of the rail support component mounting and adjusting slot 265, by exerting a releasable spring-provided clamping force that holds the rail support component and the upwardly bent mounting end of the second rail tightly together unless deliberately released to reposition the second rail 255a. The third axis retention pin device 300 may or may not be of the same or similar construction and operation as the third axis retention pin device 225 of the exemplary embodiment shown in FIGS. 7A-7B.

An indicating element may be optionally associated with the rail support component 275 for the purpose of indicating the third axis position of the second rail 255a and a scanner supported thereby. In the exemplary embodiment of FIGS. 9A-9B, the indicating element is an indicator pin 305 that extends from the upwardly-extending tab 290 of the rail support component 275 so as to protrude through the position indicator slot 270 of the upwardly bent mounting end 260 of the second rail 255a and to align with a given marking of the graduated scale 280. In this manner, the third axis position of the second rail 255a may be easily ascertained as the second rail is placed in different third axis positions. Other second rail and scanner third axis position indication means may be employed in other embodiments.

Figure 10:
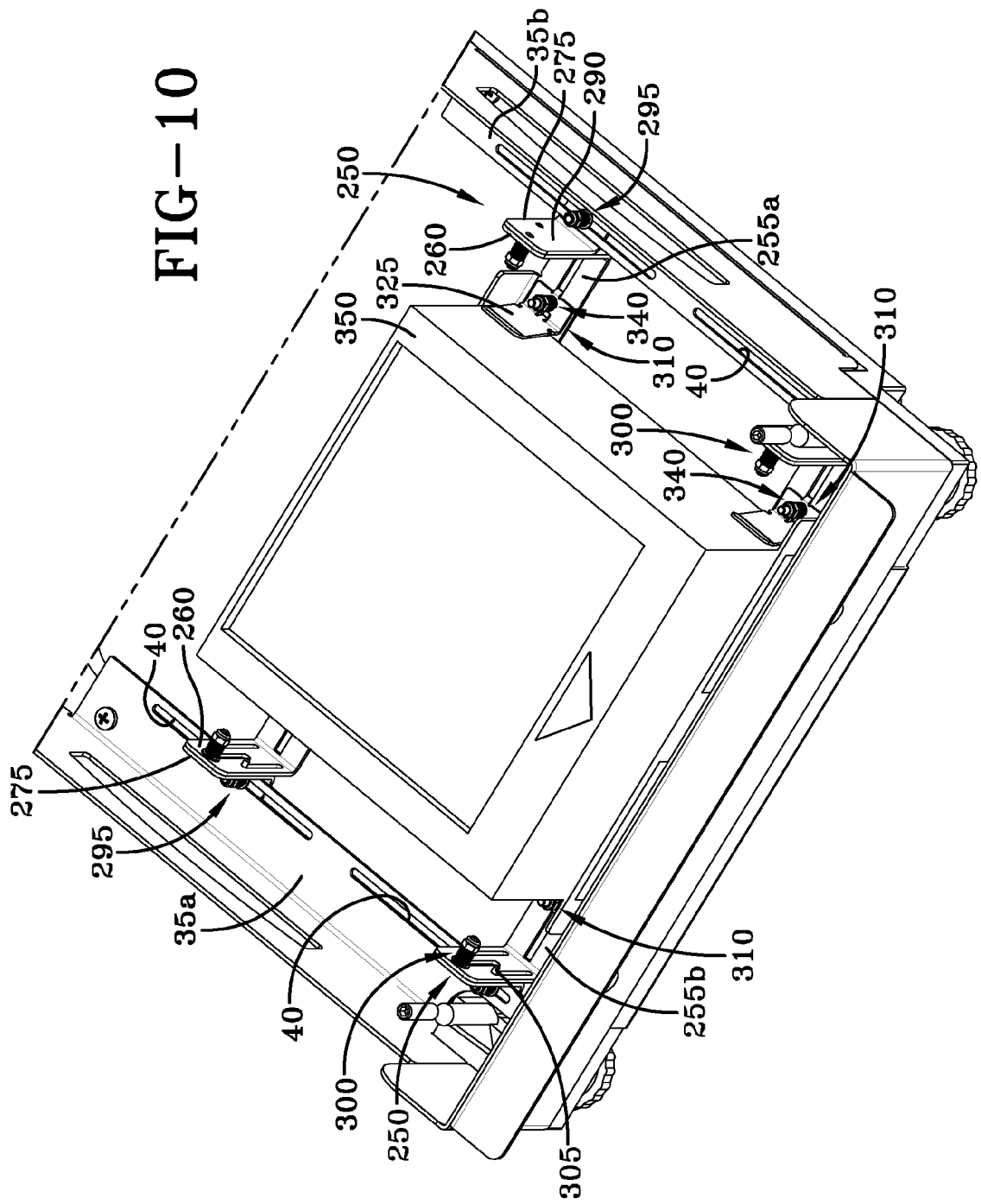
FIG. 10 depicts the third axis adjustment mechanism of FIGS. 9A-9B being used to mount an exemplary scanner to an exemplary scale/scanner device.

Positioning of a scanner along a lateral (X-Y) axis with respect to a scanner window is accomplished in this exemplary embodiment by separate spring-loaded scanner locating mechanisms. One such exemplary spring-loaded scanner locating mechanism 310 is shown in FIGS. 9A-9B and FIG. 10. As shown, this exemplary spring-loaded scanner locating mechanism 310 includes a scanner stop element 315 and a spring-loaded retention pin device 340. The spring-loaded retention pin device 340 may be constructed and operate in the same or a similar manner as the spring-loaded retention pin device 80 shown in detail in FIG. 5A or the spring-loaded retention pin device 160 of FIGS. 7A-7B.

The scanner stop element 315 includes a base leg 320 and an upwardly extending scanner locating tab 325. The base leg 315 is slidable over a top surface of the second rail 255a and, in this embodiment, includes a pair of downwardly extending guide tabs 330 that are sized to pass through the slots 335 in the rails 255a (complimentary rail not shown) of the modified second mounting rail set. The guide tabs 330 help to guide the spring-loaded scanner locating mechanism 310 along the second mounting rails when the position of the scanner is adjusted. The scanner locating tab 325 extends upward from the base leg 320 of the scanner stop element 315 and functions to serve as a hard stop to scanner movement when spring-loaded scanner locating mechanism 310 is properly positioned on the rails of the second mounting rail set and secured thereto by the spring-loaded retention pin device 340.

A scanner locating third axis adjustment mechanism 250 embodiment such as that shown in FIGS. 9A-9B may also employ a different spring-loaded scanner locating mechanism 310. For example, and without limitation, a spring-loaded scanner locating mechanism such as the spring-loaded scanner locating mechanism 75 depicted in FIGS. 2-4 and FIG. 5A and described above may also be used.

Referring now particularly to FIG. 9A, a lowermost position of the second rail 255a of this particular exemplary embodiment of the third axis adjustment mechanism 250 may be observed. As shown, in this position, the third axis retention pin device 300 is at or near the top of the rail support component mounting and adjusting slot 265 and the indicator pin 305 is at or near the top of the position indicator slot 270 in the upwardly bent mounting end 260 of the second rail 255a and aligned with the uppermost one of the graduated markings 280. In this position, the scanner support surface 345 of the second rail 255a can be observed to lie at a lower point than the upper surface of the first set of rails 35a, 35b to which the second rail is attached. It should be realized that the particular relationship of elements in the exemplary embodiment of the third axis adjustment mechanism 250 of FIG. 9A is shown and described only for purposes of illustration, and the exact relationship of the various elements may be different in other embodiments.

Referring now particularly to FIG. 9B, an uppermost position of the second rail 255a of this particular exemplary embodiment of the third axis adjustment mechanism 250 may be observed. As shown, in this position, the third axis retention pin device 300 is at or near the bottom of the rail support component mounting and adjusting slot 265 and the indicator pin 305 is at or near the bottom of the position indicator slot 270 in the upwardly bent mounting end 260 of the second rail 255a and aligned with the lowermost one of the graduated markings 280. In this position, the scanner support surface 345 of the second rail 255a can be observed to lie at a higher point than the upper surface of the first set of rails 35a, 35b to which the second rail is attached. It should be realized that the particular relationship of elements in the exemplary embodiment of the third axis adjustment mechanism 250 of FIG. 9B is shown and described only for purposes of illustration, and the exact relationship of the various elements may be different in other embodiments.

The third axis adjustment mechanisms 250 and the associated spring-loaded scanner locating mechanisms 310 of FIGS. 9A-9B are depicted in a scanner supporting function in FIG. 10. As shown, second rails 255a, 255b are mounted between first rails 35a, 35b of a first mounting rail set 35 via the third axis adjustment mechanisms 250. More particularly, the second rails 255a, 255b are slidably affixed to the first rails 35a, 35b by rail support components 275 attached to corresponding upwardly bent mounting ends 260 of the second rails 255a, 255b and by associated spring-loaded rail support component retention devices 295 that pass through the slots 40 in the first rails 35a, 35b. Similarly, the position of the spring-loaded scanner locating mechanisms 310 along the length of the rails 255a, 255b has been secured by the spring-loaded retention pin devices 340 thereof, as also previously described above. Consequently, the upwardly-extending tabs 325 of the spring-loaded scanner locating mechanism scanner stop elements 315 serve as a hard stop to lateral/horizontal (Y axis) movement of a scanner 350 along the length of the rails 255a, 255b. As would be understood from the previous description of exemplary embodiments, lateral movement of the scanner 350 in the opposite lateral (Y) direction is restricted by respective upstanding walls 355a, 355b of the second rails 255a, 255b.

As shown in FIG. 10, the second rails 255a, 255b and the scanner 350 are set at a lowermost position. If it is desired to raise the scanner position, the third axis retention pin devices 300 are operated by a user to release the exerted clamping force and the respective second rail 255a, 255b is slid upward along the second rail mounting tab 290 of the rail support component 275 until the desired third axis position is reached. As with the positions of the exemplary spring-loaded scanner locating mechanisms 75, 155 described herein, a proper third axis position for a given scanner may be indicated in a service manual, etc., by way of a graduated marking callout or a similar position indication callout. For example, a proper third axis position for the scanner 350 may coincide with a third axis position of the second rails 255a, 255b that results in the indicator pin 305 being aligned with a graduated marking 280 designated by a given numeral, etc. The second rails 255a, 255b may be set to the same third axis positions to achieve a substantially level scanner orientation, or different third axis positions may be employed to place the scanner on an angle with respect to the overlying scanner window 25 (see FIG. 1).

While certain embodiments of the invention are described in detail above, the scope of the invention is not considered limited by such disclosure, and modifications are possible without departing from the spirit of the invention as evidenced by the following claims:

What is claimed is:

1. An adjustable scanner mounting assembly, comprising:
   a pair of first mounting rails forming a part of opposite walls of a scanner/scale device housing or adapted for attachment to opposite walls of a scanner/scale device housing;
   a pair of second mounting rails adapted to cooperatively support a scanner and extending transversely between the first mounting rails and slidably connected thereto,
   a scanner retention wall extending upwardly from and along the length of each second mounting rail; and
   at least one scanner locating mechanism movably affixed to each of the second mounting rails so as to be slidable along the length thereof;
   wherein, positional adjustment of a scanner along a first axis is accomplishable by sliding the second mounting rails along the length of the first mounting rails; and
   wherein, positional adjustment of a scanner along a second axis is accomplishable by sliding the scanner locating mechanisms along the length of the second mounting rails.

2. The adjustable scanner mounting assembly of claim 1, further comprising a plurality of rail retention devices configured for releasably securing ends of the second mounting rails through associated slots in the corresponding first mounting rails.

3. The adjustable scanner mounting assembly of claim 2, wherein:
   each rail retention device includes a spring-loaded pin;
   each one of the pair of second mounting rails includes a hole near each end thereof; and
   when the rail retention devices are installed to the second mounting rails, the pin of each rail retention device is adapted to extend through one of the holes in the respective second mounting rail and through the slot in the respective first mounting rail to releasably clamp the second mounting rails against the first mounting rails.

4. The adjustable scanner mounting assembly of claim 1, wherein each scanner locating mechanism includes a scanner stop element having a base leg that engages a slot in the second mounting rail to which it is installed, and a locating tab that extends upward from the base leg.

5. The adjustable scanner mounting assembly of claim 1, further comprising a scanner locating mechanism retention device associated with each scanner locating mechanism and adapted to releasably secure the scanner locating mechanism base leg to an associated second mounting rail through at least one slot located therein.

6. The adjustable scanner mounting assembly of claim 5, wherein the scanner locating mechanism retention device includes a spring-loaded pin that is adapted to extend through the at least one slot in the second mounting rail to which the associated scanner locating mechanism is installed, and to releasably clamp the base leg of the scanner stop element against a top or bottom surface of the second mounting rail.

7. The adjustable scanner mounting assembly of claim 1, further comprising position indicating markings located along the length of each of the first mounting rails and the second mounting rails.

8. The adjustable scanner mounting assembly of claim 1, wherein the second mounting rails are adapted to permit adjustment of the spacing therebetween and the scanner locating mechanisms are adapted to permit adjustment of the spacing therebetween, such that the mounting assembly can accommodate scanners of dissimilar dimensions.

9. An adjustable scanner mounting assembly, comprising:
   a first mounting rail set having a pair of first mounting rails forming a part of opposite walls of a scanner/scale device housing or adapted for attachment to opposite walls of a scanner/scale device housing;
   at least one slot extending along the length of each first mounting rail;

a second mounting rail set having a pair of second mounting rails adapted for releasable attachment between the first mounting rails of the first mounting rail set;

at least one slot extending along the length of each second mounting rail;

a scanner retention wall extending upwardly from and along the length of each second mounting rail;

rail retention devices, each including a spring-loaded pin, for releasably clamping the second mounting rails against the first mounting rails through the at least one slot in each of the corresponding first mounting rails;

a plurality of scanner locating mechanisms releasably affixed to each of the second mounting rails, each scanner locating mechanism including a scanner stop element having a base leg that engages the at least one slot of the second mounting rail, and a locating tab that extends upward from the base leg; and a scanner locating mechanism retention device associated with each scanner locating mechanism, the scanner locating mechanism retention device including a spring-loaded pin adapted to releasably clamp the base leg of the scanner stop element against a top or bottom surface of the second mounting rail through the at least one slot located therein;

wherein, a scanner is supportable on the mounting rails of the second rail set, between the scanner retention walls thereof;

wherein, positional adjustment of a scanner along a first axis is accomplishable by sliding the second mounting rails along the length of the first mounting rails; and wherein, positional adjustment of a scanner along a second axis is accomplishable by sliding the scanner locating mechanisms along the length of the second mounting rails.

10. The adjustable scanner mounting assembly of claim 9, further comprising at least one guide tab extending from the base leg of the scanner stop element and adapted to fit within the at least one slot located in the second mounting rail.

11. The adjustable scanner mounting assembly of claim 9, further comprising position indicating markings located along the length of each of the first mounting rails and the second mounting rails.

12. The adjustable scanner mounting assembly of claim 9, wherein the second mounting rails are adapted to permit adjustment of the spacing therebetween and the scanner locating mechanisms are adapted to permit adjustment of the spacing therebetween, such that the mounting assembly can accommodate scanners of dissimilar dimensions.

* * * * *